US010673410B2

(12) United States Patent
Shoda

(10) Patent No.: US 10,673,410 B2
(45) Date of Patent: Jun. 2, 2020

(54) RADIO-FREQUENCY (RF) MODULE, AND METHOD OF MANUFACTURING ELASTIC WAVE FILTER

(71) Applicant: Murata Manufacturing Co., Ltd., Nagaokakyo-shi, Kyoto-fu (JP)

(72) Inventor: Chihiro Shoda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 165 days.

(21) Appl. No.: 15/649,677

(22) Filed: Jul. 14, 2017

(65) Prior Publication Data

US 2018/0041192 A1  Feb. 8, 2018

(30) Foreign Application Priority Data

Aug. 5, 2016  (JP) .................. 2016-155024

(51) Int. Cl.
*H03H 9/64* (2006.01)
*H03H 9/02* (2006.01)
*H03F 3/195* (2006.01)
*H03H 9/00* (2006.01)
(Continued)

(52) U.S. Cl.
CPC ............. *H03H 9/6489* (2013.01); *H03F 1/56* (2013.01); *H03F 3/195* (2013.01); *H03H 3/10* (2013.01); *H03H 9/0009* (2013.01); *H03H 9/02535* (2013.01); *H03H 9/6436* (2013.01); *H03H 9/6483* (2013.01); *H03F 2200/222* (2013.01); *H03F 2200/294* (2013.01); *H03F 2200/451* (2013.01)

(58) Field of Classification Search
CPC ............... H03H 9/6489; H03H 9/0009; H03H 9/02535; H03H 3/10; H03F 1/56; H03F 3/195
See application file for complete search history.

(56) References Cited

U.S. PATENT DOCUMENTS

2008/0116993 A1  5/2008  Yamakawa et al.
2009/0243703 A1  10/2009  Furutani
(Continued)

FOREIGN PATENT DOCUMENTS

JP  07-7451 A  1/1995
JP  2008-532334 A  8/2008
(Continued)

OTHER PUBLICATIONS

Official Communication issued in Japanese Patent Application No. 2016-155024, dated Jan. 8, 2019.

*Primary Examiner* — Samuel S Outten
(74) *Attorney, Agent, or Firm* — Keating & Bennett, LLP

(57) ABSTRACT

A radio frequency module includes an elastic wave filter and a low-noise amplifier that amplifies an RF signal output from the elastic wave filter. An output impedance of the elastic wave filter is positioned, on a Smith chart, closer to a noise matching impedance than to a gain matching impedance, at a frequency of at least one of a low frequency end and a high frequency end of a passband of the elastic wave filter. The noise matching impedance indicates the output impedance where a noise figure of the LNA becomes minimum. The gain matching impedance indicates the output impedance where a gain of the LNA becomes maximum.

18 Claims, 19 Drawing Sheets

(51) Int. Cl.
*H03H 3/10* (2006.01)
*H03F 1/56* (2006.01)

(56) References Cited

U.S. PATENT DOCUMENTS

| | | | |
|---|---|---|---|
| 2010/0109802 A1* | 5/2010 | Tanaka | H03H 9/725 |
| | | | 333/133 |
| 2013/0113576 A1* | 5/2013 | Inoue | H03H 9/6433 |
| | | | 333/133 |
| 2014/0015614 A1* | 1/2014 | Oliveira | H03F 1/26 |
| | | | 330/307 |
| 2016/0099734 A1 | 4/2016 | Wallis | |
| 2016/0173061 A1 | 6/2016 | Takamine | |
| 2016/0352494 A1 | 12/2016 | Uejima et al. | |

FOREIGN PATENT DOCUMENTS

| | | |
|---|---|---|
| JP | 2009-060511 A | 3/2009 |
| KR | 10-2016-0040990 A | 4/2016 |
| KR | 10-2016-0043100 A | 4/2016 |
| WO | 2008/075551 A1 | 6/2008 |
| WO | 2015/125638 A1 | 8/2015 |

\* cited by examiner

RADIO-FREQUENCY (RF) MODULE, AND METHOD OF MANUFACTURING ELASTIC WAVE FILTER

CROSS REFERENCE TO RELATED APPLICATIONS

This application claims the benefit of priority to Japanese Patent Application No. 2016-155024 filed on Aug. 5, 2016. The entire contents of this application are hereby incorporated herein by reference.

BACKGROUND OF THE INVENTION

1. Field of the Invention

The present invention relates to a radio-frequency (RF) module and to a method of manufacturing an elastic wave filter including a subsequent stage connected to a low-noise amplifier (LNA).

2. Description of the Related Art

There has been an increasing amount of demands for RF circuits including LNAs because of an increase in the speed of electronic devices and the spread of high-speed wireless communication. In a communication apparatus that includes such an LNA in a reception circuit, a matching circuit is provided between the LNA and a filter circuit preceding the LNA (for example, see Japanese Unexamined Patent Application Publication No. 2009-60511).

The input impedance and output impedance of such a matching circuit are normalized impedances with respect to a reception signal. In short, the matching circuit is configured to have an input impedance and an output impedance that are normalized impedances in the passband of the filter circuit.

However, the configuration including the above-mentioned matching circuit and the filter circuit along with the LNA may have the following problems. That is, the LNA greatly influences the characteristic of having low noise in an RF module including the LNA or the entire system, such as the communication apparatus. For this reason, it is generally preferable for the LNA to have both the maximum gain and the minimum noise figure. Meanwhile, generally there is a difference between an impedance where the gain of the LNA becomes maximum and an impedance where the noise figure becomes minimum. Therefore, when the filter circuit and the LNA are subjected to impedance matching by the matching circuit such that the gain becomes maximum with respect to the passband of the filter circuit, the noise figure of the LNA tends to deteriorate particularly at an end of the passband. In this case, it is difficult to improve the transmission characteristics of the RF module and the like.

SUMMARY OF THE INVENTION

Preferred embodiments of the present invention provide RF modules and methods of manufacturing an elastic wave filter capable of improving transmission characteristics by decreasing deterioration of the noise figure at an end of the passband.

According to a preferred embodiment of the present invention, a radio-frequency (RF) module includes an elastic wave filter, and a low-noise amplifier (LNA) that amplifies an RF signal output from the elastic wave filter. An output impedance of the elastic wave filter is positioned, on a Smith chart, closer to a noise matching impedance, out of the noise matching impedance and a gain matching impedance, at a frequency of at least one of a low frequency end and a high frequency end of a passband of the elastic wave filter. The noise matching impedance indicates the output impedance where a noise figure of the LNA becomes minimum. The gain matching impedance indicates the output impedance where a gain of the LNA becomes maximum.

Because the output impedance of the elastic wave filter is closer to the noise matching impedance at the frequency of at least one of the low frequency end and the high frequency end of the passband, the noise figure of the LNA is able to be decreased at this at least one frequency. Accordingly, for the entire RF module, because deterioration of the noise figure at an end of the passband where the noise figure tends to deteriorate is able to be decreased, transmission characteristics are improved. That is, the RF module with excellent transmission characteristics are provided.

The output impedance may be positioned, on the Smith chart, closer to the noise matching impedance at both frequencies of the low frequency end and the high frequency end of the passband.

Because the output impedance of the elastic wave filter is closer to the noise matching impedance at both frequencies of the low frequency end and the high frequency end of the passband, the noise figure of the LNA is able to be decreased at both of these frequencies of the low frequency end and the high frequency end. Accordingly, for the entire RF module, because deterioration of the noise figure at ends of the passband where the noise figure tends to deteriorate are able to be decreased, transmission characteristics are improved.

The elastic wave filter may preferably include a longitudinally-coupled filter structure connected in series with a channel connecting an input end and an output end.

Because the elastic wave filter includes the longitudinally-coupled filter structure, the output impedance of the elastic wave filter is able to be easily changed by adjusting an electrode parameter, for example. Accordingly, the elastic wave filter having an appropriate output impedance is able to be configured in accordance with the noise matching impedance and the gain matching impedance defined by the design and structure of the LNA. Therefore, the output impedance of the elastic wave filter is able to be adjusted to the gain matching impedance at the center of the passband and to the noise matching impedance at the frequency of at least one of the low frequency end and the high frequency end of the passband. Accordingly, both of the gain characteristics and the noise characteristics are able to be achieved.

The noise matching impedance may preferably be positioned in an upper left area with respect to the gain matching impedance on the Smith chart. The longitudinally-coupled filter structure may be closest to the output end.

Accordingly, compared with the case where another resonator is connected between the longitudinally-coupled filter structure and the output end, the output impedance of the elastic wave filter is able to be more easily positioned in the upper left area with respect to the gain matching impedance on the Smith chart at both the low frequency end and the high frequency end of the passband. Therefore, the noise figure of the LNA is able to be decreased at both of the frequencies of the low frequency end and the high frequency end.

The noise matching impedance may preferably be positioned in a right area with respect to the gain matching impedance on the Smith chart. The elastic wave filter may preferably include a parallel trap that is closest to the output end and that is connected in series with a channel connecting the channel connecting the input end and the output end, and ground.

Accordingly, compared with the case where no parallel trap is provided, the output impedance of the elastic wave filter is able to be more easily positioned in the right area with respect to the gain matching impedance on the Smith chart at both of the low frequency end and the high frequency end of the passband. Therefore, the noise figure of the LNA is able to be decreased at both of the frequencies of the low frequency end and the high frequency end.

The parallel trap may preferably have a resonance point whose frequency is lower than the low frequency end of the passband.

With the parallel trap having the above-described resonance point, the output impedance of the elastic wave filter is able to be adjusted to the gain matching impedance at the center of the passband and to the noise matching impedance at the frequency of at least one of the low frequency end and the high frequency end of the passband. Accordingly, both of the gain characteristics and the noise characteristics are able to be achieved.

The noise matching impedance may preferably be positioned in a lower left area with respect to the gain matching impedance on the Smith chart. The elastic wave filter may preferably include a series trap that is closest to the output end and that is connected in series with the channel connecting the input end and the output end.

Accordingly, compared with the case where no series trap is provided, the output impedance of the elastic wave filter is able to be more easily positioned in the lower left area with respect to the gain matching impedance on the Smith chart at both of the low frequency end and the high frequency end of the passband. Therefore, the noise figure of the LNA is able to be decreased at both of the frequencies of the low frequency end and the high frequency end.

The series trap may preferably have an anti-resonance point whose frequency is higher than the high frequency end of the passband.

With the series trap having the above-described anti-resonance point, the output impedance of the elastic wave filter is able to be adjusted to the gain matching impedance at the center of the passband and to the noise matching impedance at the frequency of at least one of the low frequency end and the high frequency end of the passband. Accordingly, both of the gain characteristics and the noise characteristics are able to be achieved.

On the Smith chart, the locus of the output impedance in the passband may intersect a line connecting the noise matching impedance and the gain matching impedance.

With the elastic wave filter having the above-described output impedance, both of the gain characteristics and the noise characteristics are able to be achieved while decreasing deterioration of the noise figure at an end of the passband.

According to a preferred embodiments of the present invention, a method of manufacturing an elastic wave filter whose output end side is connected to a low-noise amplifier (LNA) includes obtaining a noise matching impedance and a gain matching impedance, the noise matching impedance indicating an output impedance of the elastic wave filter where a noise figure of the LNA becomes minimum, the gain matching impedance indicating the output impedance where a gain of the LNA becomes maximum; and manufacturing the elastic wave filter depending on a positional relationship between the obtained gain matching impedance and the obtained noise matching impedance on a Smith chart.

By manufacturing an elastic wave filter depending on the positional relationship on the Smith chart between these two matching impedances (gain matching impedance and noise matching impedance), an elastic wave filter capable of decreasing the noise figure of the LNA at the frequency of at least one of the low frequency end and the high frequency end of the passband is able to be manufactured. When the elastic wave filter is applied to, for example, an RF module including an LNA that amplifies an RF signal output from the elastic wave filter, the transmission characteristics of the RF module are able to be improved.

The elastic wave filter may preferably include a longitudinally-coupled filter structure connected in series with a channel connecting an input end and the output end. In the step of manufacturing the elastic wave filter, (i) when the noise matching impedance is positioned in an upper left area with respect to the gain matching impedance on the Smith chart, the elastic wave filter is manufactured such that the longitudinally-coupled filter structure will be positioned closest to the output end, (ii) when the noise matching impedance is positioned in a right area with respect to the gain matching impedance on the Smith chart, the elastic wave filter is manufactured such that a parallel trap connected in series with a channel that connects the channel connecting the input end and the output end and ground will be closest to the output end, and (iii) when the noise matching impedance is positioned in a lower left area with respect to the gain matching impedance on the Smith chart, the elastic wave filter is manufactured such that a series trap connected in series with the channel connecting the input end and the output end will be closest to the output end.

Accordingly, regardless of any positional relationship on the Smith chart between the gain matching impedance and the noise matching impedance, the output impedance of the elastic wave filter is able to be more easily positioned closer to the gain matching impedance on the Smith chart at both of the low frequency end and the high frequency end of the passband. Therefore, the elastic wave filter capable of decreasing the noise figure of the LNA at both of the frequencies of the low frequency end and the high frequency end is able to be manufactured.

With the RF modules and methods according to various preferred embodiments of the present invention, transmission characteristics are able to be improved because deterioration of the noise figure at the frequency end of the passband is able to be decreased.

The above and other features, elements, characteristics, advantages and steps of the present invention will become more apparent from the following detailed description of preferred embodiments of the present invention with reference to the attached drawings.

DETAILED DESCRIPTION OF THE PREFERRED EMBODIMENTS

Figure 1:
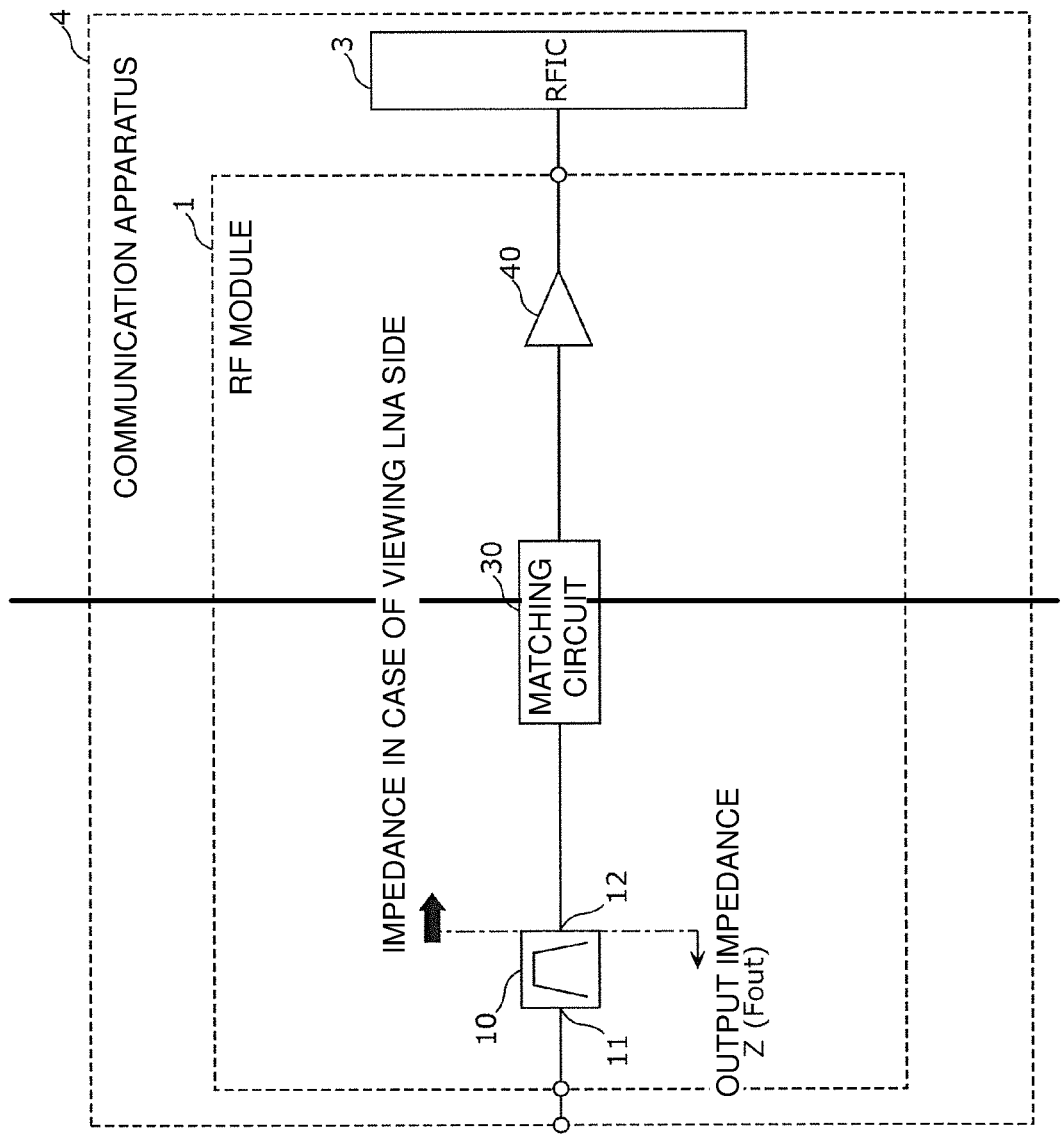
FIG. 1 is a conceptual diagram illustrating the configuration of an RF module according to a preferred embodiment of the present invention.

Hereinafter, preferred embodiments of the present invention will be described. Note that the preferred embodiments described below illustrate preferred specific examples of the present invention. Therefore, numerals, shapes, materials, elements, and the arrangement and connections of the elements described in the following preferred embodiments are only exemplary and are not to be construed to limit the present invention. Among the elements, features or steps in the following preferred embodiments, elements, features or steps not described in independent claims serving as generic claims will be described as arbitrary elements.

The drawings are only schematic drawings and are not necessarily exactly illustrated. In the drawings, the same or substantially the same configurations are given the same reference numeral, and overlapping descriptions are omitted or simplified. To facilitate the understanding of the preferred embodiments of the present invention, in illustrated electrode structures, resonators and reflectors are illustrated with fewer electrode fingers than the actual number of electrode fingers.

Preferred embodiments of the present invention will be described hereinafter.

Firstly, the configuration of a radio-frequency (RF) module 1 according to a preferred embodiment of the present invention will be described. FIG. 1 is a conceptual diagram illustrating the configuration of the RF module 1 according to the present preferred embodiment. In FIG. 1, a radio frequency integrated circuit (RFIC) 3, which is an RF signal processing circuit and which is included in a communication apparatus 4 along with the RF module 1, is also illustrated.

The RFIC 3 is an RF signal processing circuit that processes RF signals transmitted and received by an antenna device (not illustrated). Specifically, the RFIC 3 processes an RF signal (an RF reception signal here), input from the antenna device through the RF module 1, by down-converting the signal, for example, and outputs the processed signal as a reception signal to a baseband signal processing circuit (not illustrated).

Next, the detailed configuration of the RF module 1 will be described.

As illustrated in FIG. 1, the RF module 1 according to the present preferred embodiment includes an elastic wave filter 10, a matching circuit 30, and a low-noise amplifier (LNA) 40.

The elastic wave filter 10 is, for example, a band-pass filter that filters an RF signal input from the antenna device to an input end 11 (input terminal) in a certain passband and outputs the filtered RF signal from an output end 12 (output terminal). To improve the transmission characteristics of the entire RF module 1, the elastic wave filter 10 has an output impedance Z (Fout) that depends on an impedance in the case of viewing the LNA 40 side from the output end 12. This point will be described later in conjunction with an impedance required for the output end 12 of the elastic wave filter 10 from, for example, the design of the LNA 40.

Note that the output impedance Z (Fout) of the elastic wave filter 10 refers to an impedance in the case of viewing the interior of the elastic wave filter 10 from the output end 12 of the elastic wave filter 10.

In the present preferred embodiment, the elastic wave filter 10 preferably includes an elastic wave resonator that utilizes a surface acoustic wave (SAW). Note that the elastic wave filter 10 is not limited to a band-pass filter, and may be, for example, a high-pass filter or a low-pass filter. Note that the configuration of the elastic wave filter 10 is not limited to that described above, and may be, for example, a filter including an elastic wave resonator using a bulk acoustic wave (BAW) or an elastic boundary wave.

The matching circuit 30 is a circuit that adjusts the impedance in the case of viewing a circuit portion where the matching circuit 30 is connected to the LNA 40, from the output end 12 of the elastic wave filter 10. In the present preferred embodiment, the matching circuit 30 preferably includes an inductor connected in series with a channel connecting an input terminal and an output terminal of the matching circuit 30.

In general, a connection circuit provided between a previous-stage circuit and a subsequent-stage circuit is designed to have an impedance in the case of viewing the subsequent-stage circuit side from an output end of the previous-stage circuit as a characteristic impedance (such as, for example, about 50Ω).

In contrast, in the present preferred embodiment, because the matching circuit 30 includes the inductor, the impedance in the case of viewing the LNA 40 side from the output end 12 of the elastic wave filter 10 is not necessarily the characteristic impedance. Because the above-described matching circuit 30 includes fewer elements than a general T-type or π-type matching circuit, the matching circuit 30 is able to be made smaller.

Note that the configuration of the matching circuit 30 is not limited to that described above, and the matching circuit preferably includes an impedance element connected to the channel, for example. Specifically, the matching circuit 30 may preferably include an inductor or a capacitor connected in series with a channel connecting the input terminal and the output terminal, or an inductor or a capacitor connected in series with a channel connecting the aforementioned channel and the ground. In the RF module 1 according to the present preferred embodiment, the matching circuit 30 is not an essential element and may not necessarily be provided.

The LNA 40 is an amplifier that amplifies a received weak radio wave while avoiding an increase in noise as much as possible. In short, the LNA 40 is preferably a low-noise amplifier circuit that amplifies an RF signal output from the elastic wave filter 10, and includes a transistor.

Next, the detailed configuration of the elastic wave filter 10 will be described. The elastic wave filter 10 according to the present preferred embodiment includes a resonator described below, and specifically includes a longitudinally-coupled filter structure.

Figures 2A, 2B:
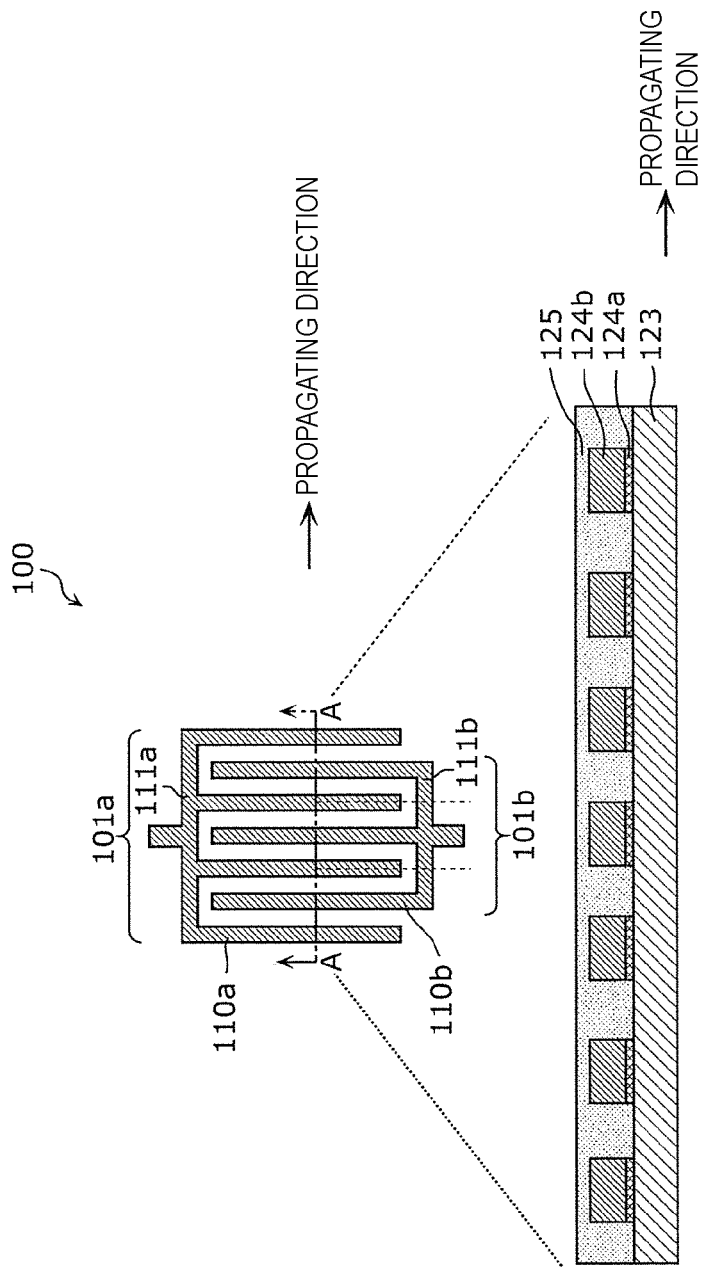
FIG. 2A, which is a plan view, and FIG. 2B, which is a cross-sectional view taken along chain line A-A illustrated in FIG. 2A, illustrate the configuration of a resonator according to a preferred embodiment of the present invention.

FIG. 2A, which is a plan view, and FIG. 2B, which is a cross-sectional view taken along chain line A-A illustrated in FIG. 2A, schematically illustrate the configuration of a resonator 100 according to the present preferred embodiment. The resonator 100 illustrated in FIGS. 2A and 2B is provided here for the purpose of describing a typical structure of a plurality of resonators included in the elastic wave filter 10, and the number and length of electrode fingers included in an electrode are not limited to those of the resonator 100.

As illustrated in FIGS. 2A and 2B, the resonator 100 includes a piezoelectric substrate 123, and an inter-digital transducer (IDT) electrode 101a and an IDT electrode 101b, which have a comb shape or approximate comb shape.

The piezoelectric substrate 123 preferably includes, for example, LiNbO₃ single crystal cut at a certain cut angle. A surface acoustic wave (SAW) propagates on the piezoelectric substrate 123 in a certain direction.

As illustrated in FIG. 2A, the pair of IDT electrodes 101a and 101b, which face each other, is provided on the piezoelectric substrate 123. The IDT electrode 101a includes a plurality of electrode fingers 110a, which are parallel or substantially parallel to each other, and a busbar electrode 111a, which connects the plurality of electrode fingers 110a. The IDT electrode 101b includes a plurality of electrode fingers 110b, which are parallel or substantially parallel to each other, and a busbar electrode 111b, which connects the plurality of electrode fingers 111b. The IDT electrode 101a and the IDT electrode 101b have a configuration in which the electrode fingers 110b of the IDT electrode 101b, which is one of the IDT electrode 101a and the IDT electrode 101b, are arranged in between the electrode fingers 110a of the IDT electrode 101a, which is the other one of the IDT electrode 101a and the IDT electrode 101b.

As illustrated in FIG. 2B, the IDT electrode 101a and the IDT electrode 101b have a configuration in which an adhesion layer 124a and a main electrode layer 124b are laminated to one another.

The adhesion layer 124a is a layer that improves the adhesion between the piezoelectric substrate 123 and the main electrode layer 124b, and, for example, NiCr may preferably be used as a material of the adhesion layer 124a.

As a material of the main electrode layer 124b, for example, Pt may preferably be used. The main electrode layer 124b may have a film thickness of one type or a plurality of types.

A protection layer 125 covers the IDT electrode 101a and the IDT electrode 101b. The protection layer 125 is a layer that protects the main electrode layer 124b from the external environment, to adjust the frequency temperature characteristics, and to improve the moisture resistance. The protection layer 125 is a layer that preferably includes, for example, silicon dioxide as a main component. The protection layer 125 may have a film thickness of one type or a plurality of types.

Note that the materials of the adhesion layer 124a, the main electrode layer 124b, and the protection layer 125 are not limited to those described above. Furthermore, the IDT electrode 101a and the IDT electrode 101b may not have the above-described multilayer structure. The IDT electrode 101a and the IDT electrode 101b may preferably be configured using metal or alloy, such as Ti, Al, Cu, Pt, Au, Ag, and/or Pd, or may include a plurality of multilayer bodies including the above-mentioned metal or alloy. The protection layer 125 may not be provided.

With the above-described resonator 100, the elastic wave filter 10 according to the present preferred embodiment defines the above-mentioned band-pass filter.

Here, because the noise figure of the entire RF module 1 is influenced by the transmission characteristics of the elastic wave filter 10, the noise figure tends to deteriorate particularly at a low frequency end fL (lower limit frequency of the passband) and a high frequency end fH (upper limit frequency of the passband) of the passband of the elastic wave filter 10. Therefore, to reduce or prevent the deterioration of the noise figure of the RF module 1 throughout the passband, it is necessary to improve the noise figure at the low frequency end fL and the high frequency end fH of the passband.

The inventor of the present invention has closely studied this point and has conceived to improve the noise figure by paying attention to the following point. That is, an elastic wave filter and an LNA are generally impedance-matched such that the gain of the LNA becomes maximum at the center of the passband of the elastic wave filter. However, the impedance of the LNA where the gain becomes maximum is generally different from the impedance where the noise figure becomes minimum.

Therefore, the inventor of the present invention has conceived of the idea of reducing or preventing the deterioration of the noise figure of the RF module throughout the passband of the elastic wave filter by matching the impedance of the elastic wave filter and the impedance of the LNA such that the noise figure of the LNA becomes small at the low frequency end fL and the high frequency end fH of the passband of the elastic wave filter.

Note that the relative relationship between the impedance where the gain becomes maximum and the impedance where the noise figure becomes minimum in the LNA depends on, for example, the design of the LNA. For this reason, to match the impedances as described above, it is necessary to design the elastic wave filter depending on the relative relationship between the impedance where the gain of the LNA connected to a subsequent stage of the elastic wave filter becomes maximum and the impedance where the noise figure becomes minimum.

Accordingly, the elastic wave filter 10 according to the present preferred embodiment includes the output impedance Z (Fout) adjusted depending on the impedance in the case of viewing the LNA 40 side from the output end 12. Specifically, the output impedance Z (Fout) is positioned, on the Smith chart, closer to the noise matching impedance, out of the noise matching impedance and the gain matching impedance, at the frequency of at least one of the low frequency end fL and the high frequency end fH of the passband of the elastic wave filter 10.

Here, the noise matching impedance indicates the output impedance of the elastic wave filter 10 where the noise figure of the LNA 40 becomes minimum. That is, the noise matching impedance is the complex conjugate impedance of the impedance in the case of viewing the LNA 40 side from the output end 12 of the elastic wave filter 10 when the noise figure of the LNA 40 becomes minimum. In other words, the noise matching impedance is an impedance required for the output end 12 of the elastic wave filter 10 in order for the noise figure of the LNA 40 to become minimum.

The gain matching impedance indicates the output impedance of the elastic wave filter 10 where the gain of the LNA becomes maximum. In short, the gain matching impedance is the complex conjugate impedance of the impedance in the case of viewing the LNA 40 side from the output end 12 of the elastic wave filter 10 when the gain of the LNA 40 becomes maximum. In other words, the gain matching impedance is an impedance required for the output end 12 of the elastic wave filter 10 in order for the gain of the LNA 40 to become maximum.

The positional relationship between the noise matching impedance and the gain matching impedance on the Smith chart is defined by the impedance of the LNA 40 itself and the impedance adjustment performed by the matching circuit 30 or other suitable circuit between the elastic wave filter 10 and the LNA 40. Therefore, the positional relationship between the noise matching impedance and the gain matching impedance on the Smith chart changes in accordance with circuit elements, such as the LNA 40 included in the RF module 1 and the circuit configuration of the matching circuit 30.

Figure 3A:
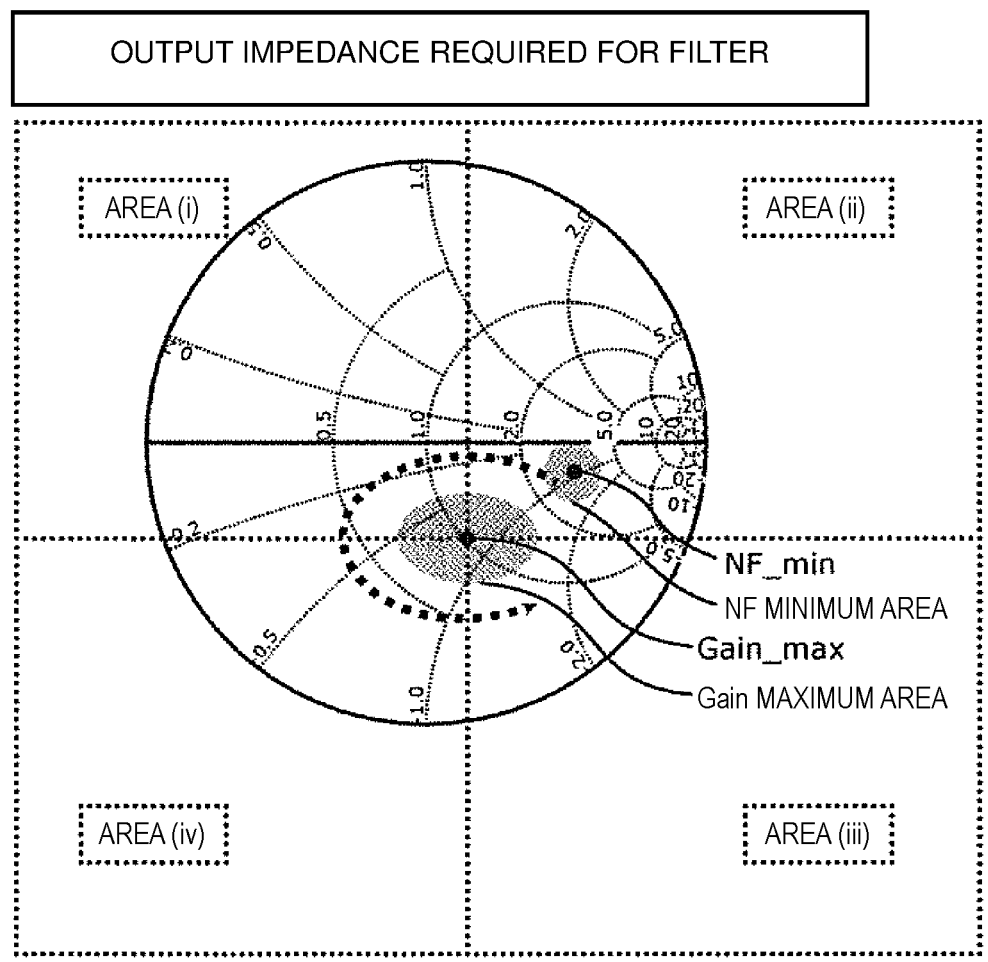
FIG. 3A is the Smith chart describing that the positional relationship between a noise matching impedance and a gain matching impedance changes.

FIG. 3A is the Smith chart describing the positional relationship between the noise matching impedance and the gain matching impedance changes.

FIG. 3A illustrates by way of example the case where a gain matching impedance Gain_max is adjusted by the matching circuit 30 or other suitable circuit to be around a certain impedance (such as greater than or equal to about 50Ω and less than about 70Ω, for example), and the following will be described on the assumption thereof. Note that the gain matching impedance Gain_max is not limited to the above-described certain impedance, and may be arbitrarily adjusted in accordance with characteristics required for the RF module 1.

A noise figure (NF) minimum area illustrated in FIG. 3A indicates, for example, an area surrounded by an NF circle where the noise figure deteriorates (increases) by a certain amount (such as, for example, about 0.1 dB) from a noise matching impedance NF_min. A gain maximum area illustrated in FIG. 3A indicates, for example, a gain circle where the gain deteriorates (decreases) by a certain amount (such as, for example, about 0.5 dB) from the gain matching impedance Gain_max. The same applies to the following drawings.

As illustrated in FIG. 3A, when the gain matching impedance Gain_max is adjusted to the certain impedance, the noise matching impedance NF_min may be positioned on the Smith chart in any direction around the gain matching impedance Gain_max.

That is, when four areas (upper left, upper right, lower left, and lower right) are defined with reference to the gain matching impedance Gain_max on the Smith chart, the noise matching impedance NF may be positioned in any of the next four areas (i) to (iv) on the Smith chart. The four areas (i) to (iv) are as follows: the area (i), which is the upper left area on the Smith chart with respect to the gain matching impedance Gain_max; the area (ii), which is the upper right area on the Smith chart with respect to the gain matching impedance Gain_max; the area (iii), which is the lower right area on the Smith chart with respect to the gain matching impedance Gain_max; and the area (iv), which is the lower left area on the Smith chart with respect to the gain matching impedance Gain_max.

Figure 3B:
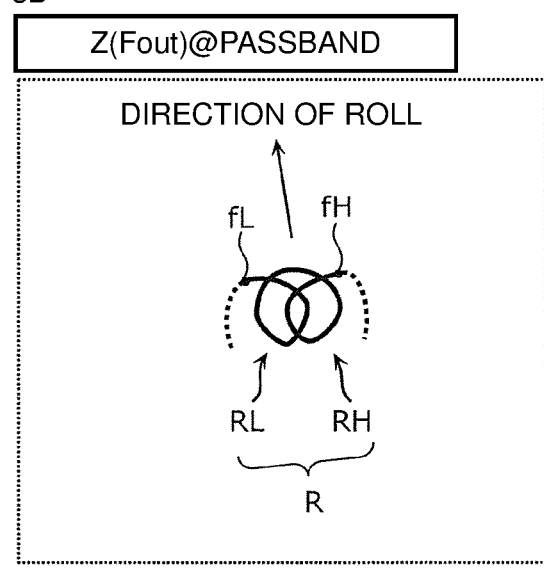
FIG. 3B is the Smith chart illustrating an output impedance in the passband of an elastic wave filter according to a preferred embodiment of the present invention.

FIG. 3B is the Smith chart illustrating the output impedance Z (Fout) in the passband of the elastic wave filter 10 according to the present preferred embodiment. Note that partial output impedances outside the passband are also illustrated by broken lines in FIG. 3B. The locus of the output impedance Z (Fout) illustrated n FIG. 3B is only exemplary, and the locus of the output impedance Z (Fout) of the elastic wave filter 10 according to the present preferred embodiment is not limited thereto.

As illustrated in FIG. 3B, the output impedance Z (Fout) of the elastic wave filter 10 provides a roll R from the low frequency end fL to the high frequency end fH of the passband on the Smith chart. The roll R includes a roll RL on the low frequency end fL side and a roll RH on the high frequency end fH side, and the low frequency end fL and the high frequency end fH are positioned on one side of the rolls RL and RH, respectively. Hereinafter, a direction that is perpendicular or substantially perpendicular to a direction in which the rolls RL and RH are arranged and that is directed to the low frequency end fL and the high frequency end fH on the Smith chart will be referred to as "the direction of the roll R".

The roll R of the output impedance Z (Fout) rotates depending on the positional relationship between the noise matching impedance NF_min and the gain matching impedance Gain_max on the Smith chart when the output impedance Z (Fout) at the center of the passband is adjusted to be the gain matching impedance Gain_max.

Figure 3C:
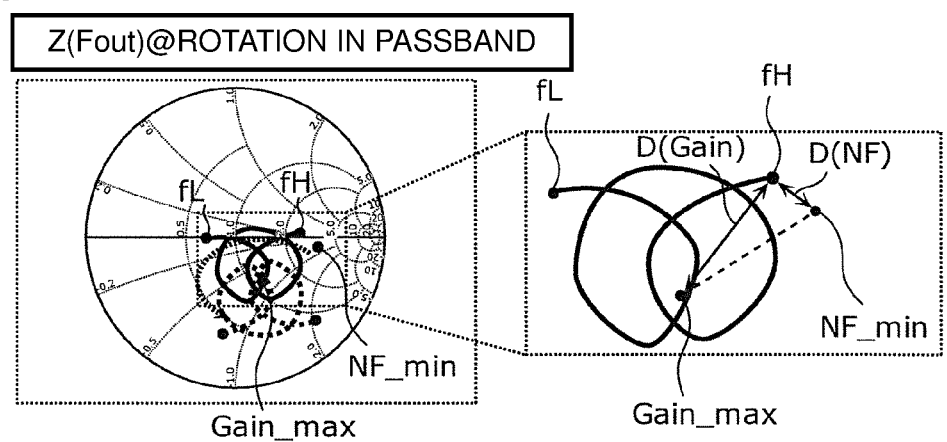
FIG. 3C includes a diagram describing that the roll of the output impedance rotates depending on the positional relationship between the noise matching impedance and the gain matching impedance on the Smith chart, and a partially enlarged view thereof.

FIG. 3C includes a diagram describing that the roll R of the output impedance Z (Fout) rotates depending on the positional relationship between the noise matching impedance NF_min and the gain matching impedance Gain_max on the Smith chart, and a partially enlarged view thereof.

As illustrated in FIG. 3C, the elastic wave filter 10 is adjusted such that, in order to achieve both of the gain characteristics and the noise characteristics, the output impedance Z (Fout) at the center of the passband is adjusted to be the gain matching impedance Gain_max, and the output impedance at at least one of the low frequency end fL and the high frequency end fH of the passband is adjusted to be closer to the noise matching impedance NF_min.

Therefore, as illustrated in FIG. 3C, when the noise matching impedance NF_min is positioned higher than the gain matching impedance Gain_max on the Smith chart, the elastic wave filter 10 has the output impedance Z (Fout) positioned closer to the noise matching impedance NF_min on the Smith chart at the frequency of at least one of the low frequency end fL and the high frequency end fH of the passband (the high frequency end fH in FIG. 3C). Therefore, the roll is roughly upward on the Smith chart.

In contrast, when the noise matching impedance NF_min is positioned lower than the gain matching impedance Gain_max on the Smith chart, the elastic wave filter 10 has the output impedance Z (Fout) positioned closer to the noise matching impedance NF_min on the Smith chart at the frequency of at least one of the low frequency end fL and the high frequency end fH of the passband (the high frequency end fH in FIG. 3C). Therefore, the roll is roughly downward on the Smith chart.

Here, the fact that the output impedance Z (Fout) is positioned closer to the noise matching impedance NF_min on the Smith chart is such that, as illustrated in the partially enlarged view, a distance D(NF) to the noise matching impedance NF_min and a distance D(Gain) to the gain matching impedance Gain_max satisfy D(NF)<D(Gain). In other words, the output impedance Z (Fout) is positioned on the noise matching impedance NF_min side across the vertical bisector of a line segment connecting the noise matching impedance NF_min and the gain matching impedance Gain_max on the Smith chart at the frequency of at least one of the low frequency end fL and the high frequency end fH of the passband.

As illustrated in the partially enlarged view, the locus of the output impedance Z (Fout) in the passband on the Smith chart intersects a line (a dotted line in the partially enlarged view) connecting the noise matching impedance NF_min and the gain matching impedance Gain_max.

By using the elastic wave filter 10 with the above-described output impedance Z (Fout), according to the present preferred embodiment, the noise figure which tends to deteriorate particularly at the low frequency end and the high frequency end of the passband of the elastic wave filter 10 is able to be improved. Therefore, transmission characteristics are able to be improved while decreasing deterioration of the noise figure of the entire RF module 1.

The configuration and impedance characteristics of the elastic wave filter 10 in accordance with the positional relationship between the gain matching impedance Gain_max and the noise matching impedance NF_min on the Smith chart will now be described in detail using examples.

As a first example of a preferred embodiment of the present invention, a case where the noise matching impedance NF_min is positioned in the upper left area (i) with respect to the gain matching impedance Gain_max on the Smith chart will be described.

Figure 4A:
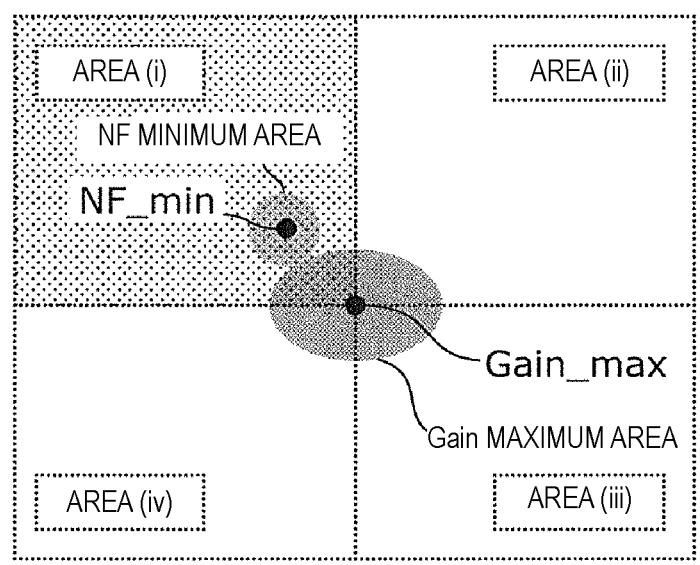
FIG. 4A is a diagram describing the position of the noise matching impedance with respect to the gain matching impedance according to a first example of a preferred embodiment of the present invention.

FIG. 4A is a diagram describing the position of the noise matching impedance NF_min with respect to the gain matching impedance Gain_max according to the first example.

As illustrated in FIG. 4A, it is assumed in the first example that the noise matching impedance NF_min is positioned in the area (i). For example, the noise matching impedance NF_min is positioned in an area of the area (i) that is relatively close to the gain matching impedance Gain_max.

Figure 4B:
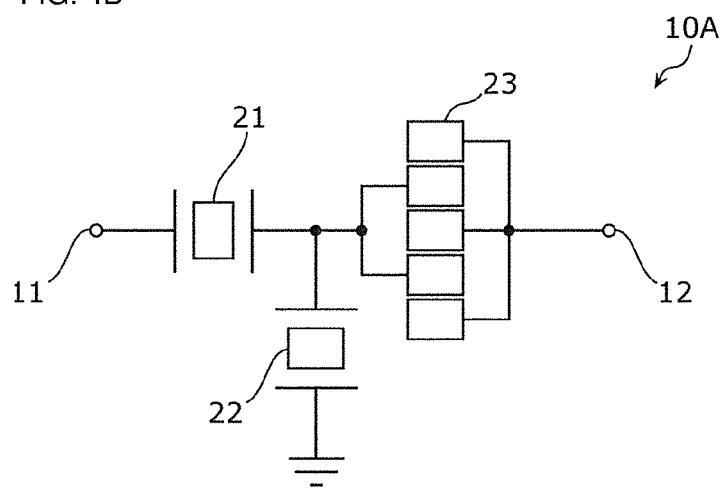
FIG. 4B is a circuit configuration diagram of an elastic wave filter according to the first example of a preferred embodiment of the present invention.

FIG. 4B is a circuit configuration diagram of an elastic wave filter 10A according to the first example.

As illustrated in FIG. 4B, the elastic wave filter 10A includes a series resonator 21, a parallel resonator 22, and a longitudinally-coupled resonator 23 in this order from the input end 11 side.

The series resonator 21 is preferably a resonator connected in series with a channel connecting the input end 11 and the output end 12. The parallel resonator 22 is preferably a resonator connected in series with a channel connecting the aforementioned channel and the ground. The series resonator 21 and the parallel resonator 22 preferably define a ladder filter structure.

The longitudinally-coupled resonator 23 is a longitudinally-coupled filter structure connected in series with a channel connecting the input end 11 and the output end 12. In the first example, the longitudinally-coupled resonator 23 is preferably closest to the output end 12. In other words, the longitudinally-coupled resonator 23 and the output end 12 are connected to each other without having another resonator disposed therebetween.

As has been described above, the elastic wave filter 10A according to the first example includes a combination of the ladder filter structure and the longitudinally-coupled filter structure. Note that the configuration of the elastic wave filter 10A is not limited to this structure, and may include, for example, only the longitudinally-coupled filter structure (i.e., the longitudinally-coupled resonator 23).

Figure 4C:
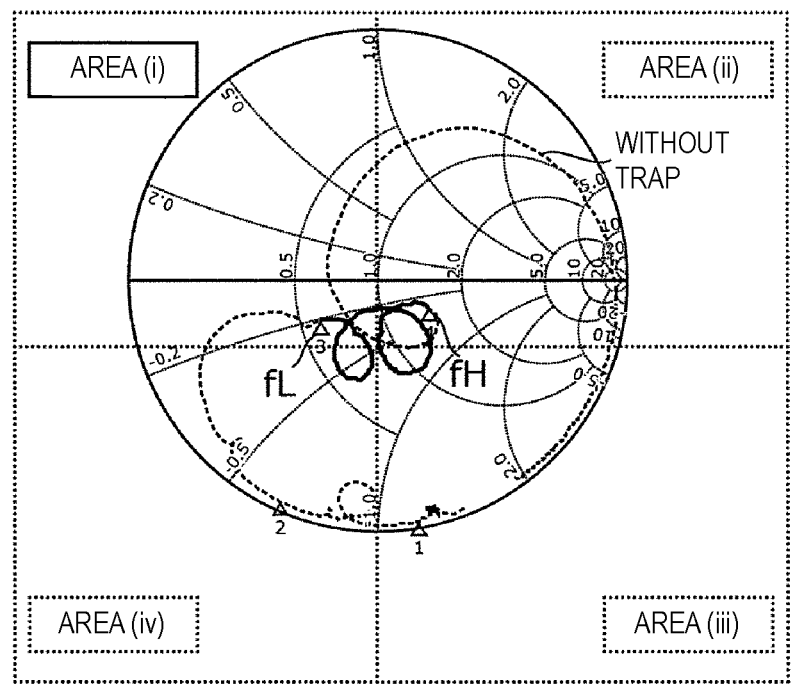
FIG. 4C is the Smith chart illustrating the output impedance of the elastic wave filter according to the first example of a preferred embodiment of the present invention.

FIG. 4C is the Smith chart illustrating the output impedance of the elastic wave filter 10A according to the first example. Note that the output impedance in the passband of the elastic wave filter 10A is indicated by a solid line, and the output impedance outside the passband is indicated by a broken line in FIG. 4C. The same applies to the Smith charts each illustrating the output impedance in the following examples.

At this time, although not illustrated in FIG. 4C, the output impedance at at least one of the low frequency end fL and the high frequency end fH of the passband (the low frequency end fL in the first example) is preferably positioned closer to the noise matching impedance NF_min than to the gain matching impedance Gain_max.

As is clear from FIG. 4C, the direction of a roll provided from the low frequency end fL to the high frequency end fH of the passband is on the area (i) side in the first example. Specifically, the output impedance at the low frequency end fL of the passband is positioned in the area (i), and the output impedance at the high frequency end fH of the passband is positioned in the area (ii).

Next, as a second example of a preferred embodiment of the present invention, a case where the noise matching impedance NF_min is positioned in the right area (ii) or (iii) with respect to the gain matching impedance Gain_max on the Smith chart will be described.

Figure 5A:
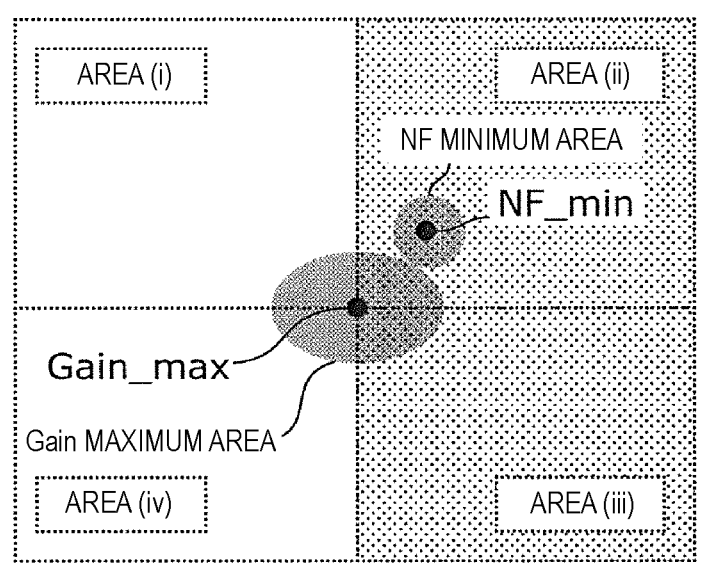
FIG. 5A is a diagram describing the position of the noise matching impedance with respect to the gain matching impedance according to a second example of a preferred embodiment of the present invention.

FIG. 5A is a diagram describing the position of the noise matching impedance NF_min with respect to the gain matching impedance Gain_max according to the second example.

As illustrated in FIG. 5A, it is assumed in the second example that the noise matching impedance NF_min is positioned in the area (ii) or (iii). For example, the noise matching impedance NF_min is positioned in an area of the area (ii) that is relatively close to the gain matching impedance Gain_max.

Figure 5B:
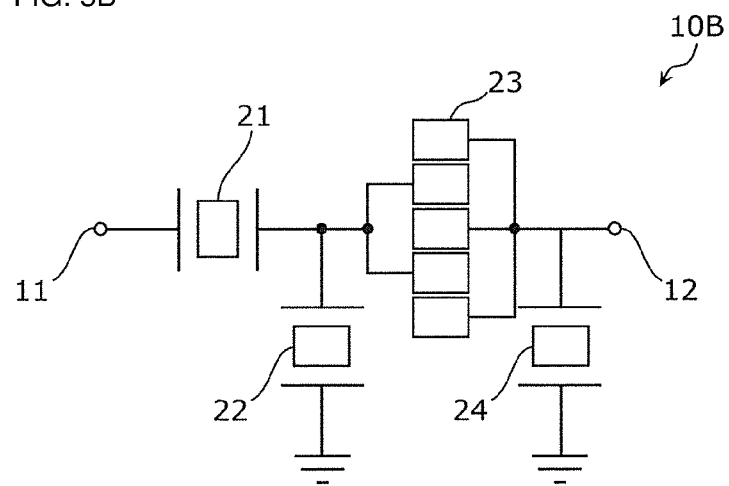
FIG. 5B is a circuit configuration diagram of an elastic wave filter according to the second example of a preferred embodiment of the present invention.

FIG. 5B is a circuit configuration diagram of an elastic wave filter 10B according to the second example.

As illustrated in FIG. 5B, the elastic wave filter 10B further includes a parallel resonator 24, instead of the elastic wave filter 10A according to the first example.

The parallel resonator 24 is positioned closest to the output end 12, and is preferably a parallel trap connected in series with a channel connecting a channel that connects the input end 11 and the output end 12 and the ground. In other words, the parallel resonator 24 and the output end 12 are connected to each other without having another resonator disposed therebetween.

As has been described above, the elastic wave filter 10B according to the second example includes the parallel trap in addition to the combination of the ladder filter structure and the longitudinally-coupled filter structure. Note that the configuration of the elastic wave filter 10B is not limited to this structure, and may include, for example, only the longitudinally-coupled filter structure (i.e., the longitudinally-coupled resonator 23) and the parallel trap (i.e., the parallel resonator 24).

Here, the parallel resonator 24 (parallel trap) preferably has a resonance point whose frequency is lower than the low frequency end fL of the passband of the elastic wave filter 10B. That is, fr<fL is preferably satisfied where fr denotes the frequency of the resonance point (resonant frequency).

Figure 5C:
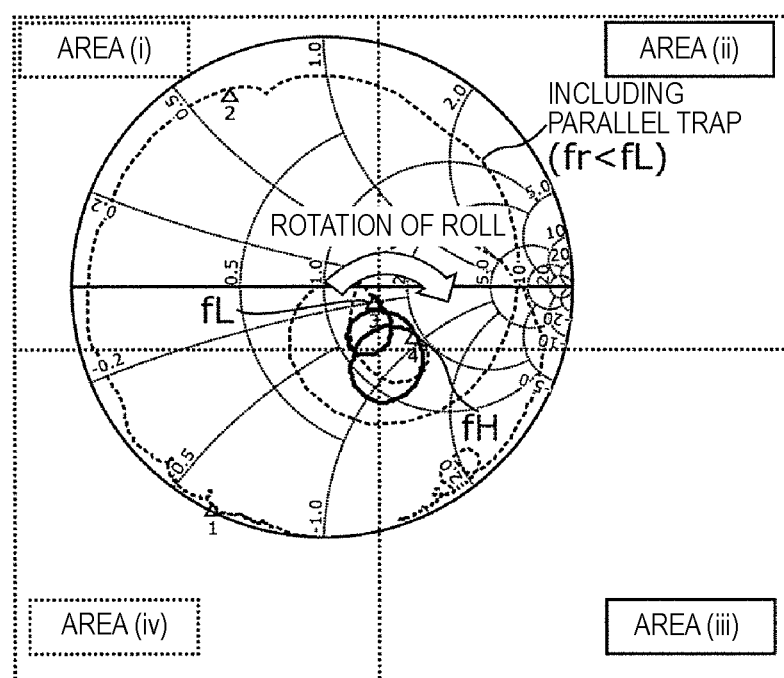
FIG. 5C is the Smith chart illustrating the output impedance of the elastic wave filter according to the second example of a preferred embodiment of the present invention.

FIG. 5C is the Smith chart illustrating the output impedance of the elastic wave filter 10B according to the second example.

At this time, although not illustrated in FIG. 5C, the output impedance at at least one of the low frequency end fH and the high frequency end fH (the high frequency end fH in the second example) of the passband is preferably positioned closer to the noise matching impedance NF_min than to the gain matching impedance Gain_max.

As is clear from FIG. 5C, in the second example, the direction of a roll provided from the low frequency end fL to the high frequency end fH of the passband is on the area (ii) side. In short, because the elastic wave filter 10B according to the second example additionally includes the parallel resonator 24 (parallel trap), compared with the elastic wave filter 10A according to the first example, the direction of the above-mentioned roll is rotated clockwise. Specifically, the output impedance at the low frequency end fL of the passband is positioned in the area (i), and the output impedance at the high frequency end fH of the passband is positioned in the area (ii).

Next, as a third example of a preferred embodiment of the present invention, a case where the noise matching impedance NF_min is positioned in the lower left area (iv) with respect to the gain matching impedance Gain_max on the Smith chart will be described.

Figure 6A:
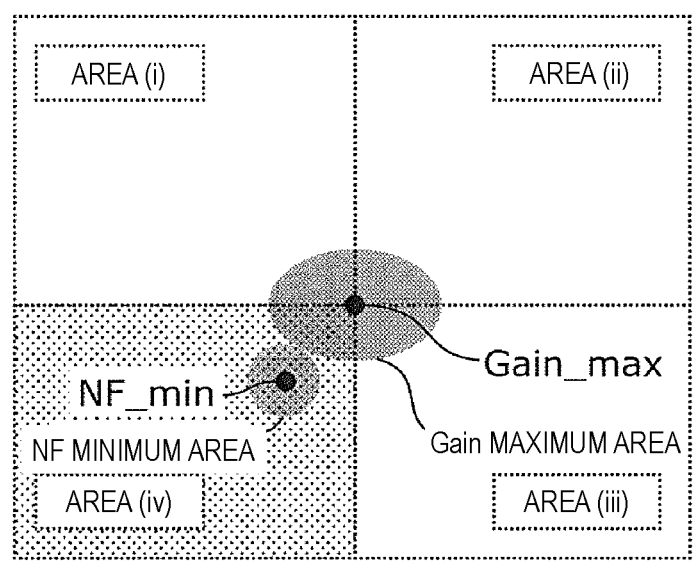
FIG. 6A is a diagram describing the position of the noise matching impedance with respect to the gain matching impedance according to a third example of a preferred embodiment of the present invention.

FIG. 6A is a diagram describing the position of the noise matching impedance NF_min with respect to the gain matching impedance Gain_max according to the third example.

As illustrated in FIG. 6A, it is assumed in the third example that the noise matching impedance NF_min is positioned in the area (iv). For example, the noise matching impedance NF_min is positioned in an area of the area (iv) that is relatively close to the gain matching impedance Gain_max.

Figure 6B:
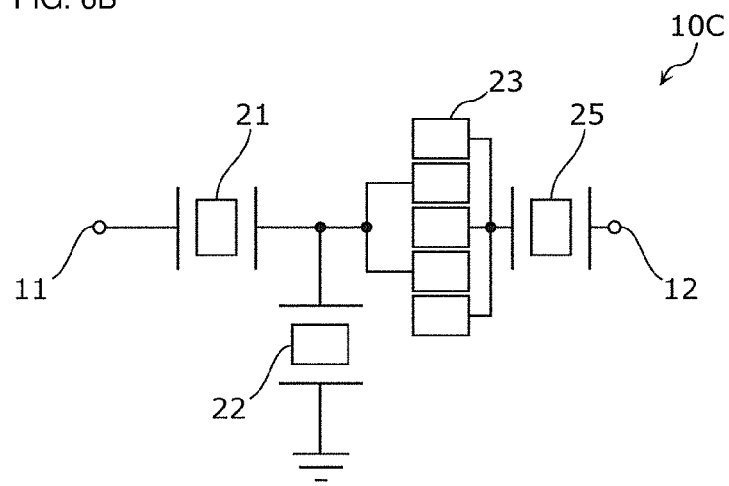
FIG. 6B is a circuit configuration diagram of an elastic wave filter according to the third example of a preferred embodiment of the present invention.

FIG. 6B is a circuit configuration diagram of an elastic wave filter 10C according to the third example.

As illustrated in FIG. 6B, the elastic wave filter 10C preferably further includes a series resonator 25, compared the elastic wave filter 10A according to the first example.

The series resonator 25 is a series trap that is closest to the output end 12 and that is connected in series with a channel connecting the input end 11 and the output end 12. In other words, the series resonator 25 and the output end 12 are connected to each other without having another resonator disposed therebetween.

As has been described above, the elastic wave filter 10C according to the third example preferably includes the series trap in addition to the combination of the ladder filter structure and the longitudinally-coupled filter structure. Note that the configuration of the elastic wave filter 10C is not limited to this configuration, and may include, for example, only the longitudinally-coupled filter structure (i.e., the longitudinally-coupled resonator 23) and the series trap (i.e., the series resonator 25).

Here, the series resonator 25 (series trap) has an anti-resonance point whose frequency is higher than the high frequency end fH of the passband of the elastic wave filter 10C. In short, fa>fH is preferably satisfied where fa denotes the frequency of the anti-resonance point (anti-resonant frequency).

Figure 6C:
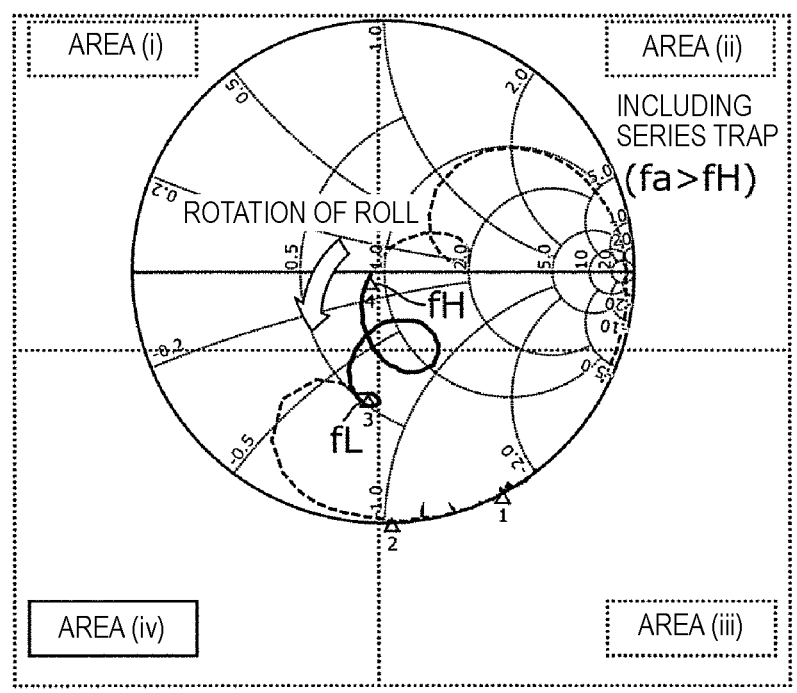
FIG. 6C is the Smith chart illustrating the output impedance of the elastic wave filter according to the third example of a preferred embodiment of the present invention.

FIG. 6C is the Smith chart illustrating the output impedance of the elastic wave filter 10C according to the third example.

At this time, although not illustrated in FIG. 6C, the output impedance at at least one of the low frequency end fH and the high frequency end fH (both the low frequency end fL and the high frequency end fH in the third example) of the passband is preferably positioned closer to the noise matching impedance NF_min than to the gain matching impedance Gain_max.

As is clear from FIG. 6C, in the third example, the direction of a roll provided from the low frequency end fL to the high frequency end fH of the passband corresponds to a boundary between the area (i) and the area (ii). In short, because the elastic wave filter 10C according to the third example additionally includes the series resonator 25 (series trap), compared with the elastic wave filter 10A according to the first example, the direction of the above-mentioned roll rotates anticlockwise. Specifically, the output impedance at the low frequency end fL of the passband is positioned in the area (iv), and the output impedance at the high frequency end fH of the passband is positioned in the area (i).

The elastic wave filter 10 according to a preferred embodiment of the present invention, which has been described using the above first to third examples, is preferably manufactured by, for example, the following manufacturing process (manufacturing method).

Figure 7:
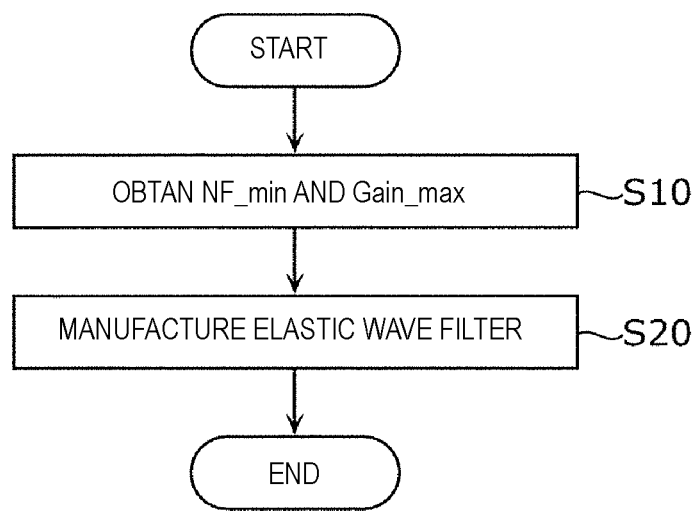
FIG. 7 is a flowchart illustrating a process of manufacturing an elastic wave filter according to a preferred embodiment of the present invention.

FIG. 7 is a flowchart illustrating a process of manufacturing the elastic wave filter 10 according to a preferred embodiment of the present invention. In other words, FIG. 7 illustrates a process of manufacturing the elastic wave filter 10 whose output end 12 side is connected to the LNA 40.

As illustrated in FIG. 7, the method of manufacturing the elastic wave filter 10 includes a first step (S10) of obtaining the noise matching impedance NF_min and the gain matching impedance Gain_max, and a second step (S20) of manufacturing the elastic wave filter 10.

In the first step (S10), for example, in the RF module 1 before the elastic wave filter 10 is manufactured, the impedance on the LNA 40 side is measured from a point that will become the output end 12 of the elastic wave filter 10, so as to obtain two matching impedances (noise matching impedance NF_min and gain matching impedance Gain_max).

A procedure for obtaining these two matching impedances is not limited to the above, and the two matching impedances may preferably be obtained by an automatic tool, such as electronic design automation (EDA) using specifications, such as the configuration of the LNA 40, and a circuit configuration from the elastic wave filter 10 to the LNA 40. That is, the first step (S10) may be executed by a computer having the automatic tool, for example.

In the second step (S20), the elastic wave filter 10 is manufactured in accordance with the positional relationship between the two matching impedances, which are obtained in the first step (S10), on the Smith chart. In the second step, for example, a computer determines the positional relationship between the two matching impedances, and, using the determination result, a computer-aided design (CAD) device or other suitable device determines the configuration and design parameters of the elastic wave filter 10. Resonators and other circuit components are manufactured in accordance with the determined configuration and design parameters, so as to manufacture the elastic wave filter 10.

At least a portion of the first step and the second step may preferably be executed by a computer using an interactive operation performed by a designer with the computer.

In the second step (S20), (i) when the noise matching impedance NF_min is positioned in the upper left area (the above-described area (i)) with respect to the gain matching impedance Gain_max on the Smith chart, the elastic wave filter 10 is manufactured such that the longitudinally-coupled filter structure will be positioned closest to the output end 12. In other words, in this case, the elastic wave filter 10A according to the first example of a preferred embodiment of the present invention is manufactured as the elastic wave filter 10 in the second step.

In the second step (S20), (ii) when the noise matching impedance NF_min is positioned in the right area (the above-described area (ii) or (iii)) with respect to the gain matching impedance Gain_max on the Smith chart, the elastic wave filter 10 is manufactured such that the parallel trap (i.e., the parallel resonator 24) connected in series with a channel connecting a channel that connects the input end 11 and the output end 12 and the ground will be closest to the output end 12. In other words, in this case, the elastic wave filter 10B according to the second example is manufactured as the elastic wave filter 10 in the second step.

In the second step (S20), (iii) when the noise matching impedance NF_min is positioned in the lower left area (the above-described area (iv)) with respect to the gain matching impedance Gain_max on the Smith chart, the elastic wave filter 10 is manufactured such that the series trap (i.e., the series resonator 25) connected in series with a channel connecting the input end 11 and the output end 12 will be closest to the output end 12. In other words, in this case, the elastic wave filter 10C according to the third example is manufactured as the elastic wave filter 10 in the second step.

With the above-described manufacturing process, an elastic wave filter 10 according to a preferred embodiment of the present invention is manufactured.

The RF module 1 according to a preferred embodiment of the present invention has been described using the elastic wave filters 10A to 10C according to the first to third examples as the elastic wave filter 10. Hereinafter, advantageous effects achieved by the RF module 1 will be described.

As has been described above, with the RF module 1 according to a preferred embodiment of the present invention, because the output impedance Z (Fout) of the elastic wave filter 10 is positioned closer to the noise matching impedance NF_min at the frequency of at least one of the low frequency end fL and the high frequency end fH of the passband, the noise figure of the LNA is able to be decreased at the at least one frequency. Accordingly, for the entire RF module 1, transmission characteristics are able to be improved because deterioration of the noise figure at an end of the passband where the noise figure tends to deteriorate is able to be decreased. That is, the RF module 1 with excellent transmission characteristics is able to be provided.

In particular, according to the RF module 1 according to a preferred embodiment of the present invention, for example in the second example, because the output impedance Z (Fout) of the elastic wave filter 10 is positioned closer to the noise matching impedance NF_min at both frequencies of the low frequency end fL and the high frequency end fH of the passband, the noise figure of the LNA 40 is able to be decreased at these two frequencies of the low frequency end fL and the high frequency end fH. Accordingly, for the entire RF module 1, transmission characteristics are able to be further improved because deterioration of the noise figure at two ends of the passband where the noise figure tends to deteriorate is able to be decreased.

According to the RF module 1 according to a preferred embodiment of the present invention, because the elastic wave filter 10 includes the longitudinally-coupled filter structure (i.e., the longitudinally-coupled resonator 23), the output impedance Z (Fout) of the elastic wave filter 10 is able to be easily changed by adjusting an electrode parameter, for example. Therefore, the elastic wave filter 10 with the appropriate output impedance Z (Fout) is able to be configured in accordance with the noise matching impedance NF_min and the gain matching impedance Gain_max defined by the design of the LNA 40. Accordingly, for example, the output impedance Z (Fout) of the elastic wave filter 10 is able to be adjusted to the gain matching impedance Gain_max at the center of the passband and to the noise matching impedance NF_min at the frequency of at least one of the low frequency end fL and the high frequency end fH of the passband. Accordingly, both of the gain characteristics and the noise characteristics are able to be achieved.

With the RF module 1 according to a preferred embodiment of the present invention, for example in the first example, compared with a case where another resonator is connected between the longitudinally-coupled filter structure and the output end, the output impedance Z (Fout) of the elastic wave filter 10 is able to be more easily positioned in the upper left area with respect to the gain matching impedance Gain_max on the Smith chart at both of the low frequency end fL and the high frequency end fH of the passband. Therefore, the noise figure of the LNA 40 is able be decreased at both frequencies of the low frequency end fL and the high frequency end fH.

With the RF module 1 according to a preferred embodiment of the present invention, for example in the second example, because there is the parallel trap (i.e., the parallel resonator 24), which is closest to the output end, compared with a case where there is no parallel trap, the output impedance Z (Fout) of the elastic wave filter 10 is able to be more easily positioned in the right area with respect to the gain matching impedance Gain_max on the Smith chart at both of the low frequency end fL and the high frequency end fH of the passband. Therefore, the noise figure of the LNA 40 is able to be decreased at both frequencies of the low frequency end fL and the high frequency end fH.

Specifically, for example in the second example, the parallel trap preferably has a resonance point whose frequency is lower than the low frequency end fL of the passband. With the parallel trap with such a resonance point, the output impedance Z (Fout) of the elastic wave filter 10 is able to be adjusted to the gain matching impedance Gain_max at the center of the passband and to the noise matching impedance NF_min at the frequency of at least one of the low frequency end fL and the high frequency end fH of the passband.

This point will be described using a comparative example of the second example (a first comparative example).

Figure 8A:
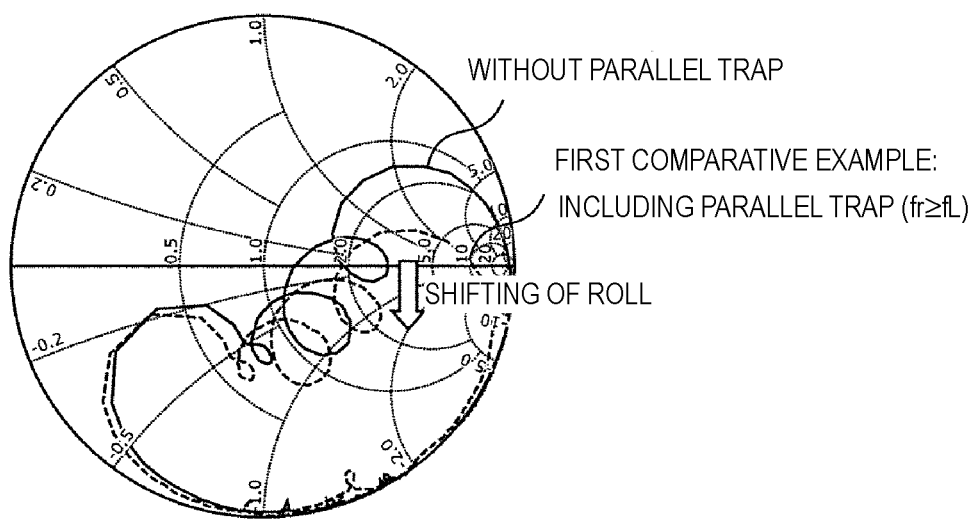
FIG. 8A is the Smith chart illustrating the output impedance of each of an elastic wave filter including no parallel trap and an elastic wave filter according to a first comparative example.
Figure 8B:
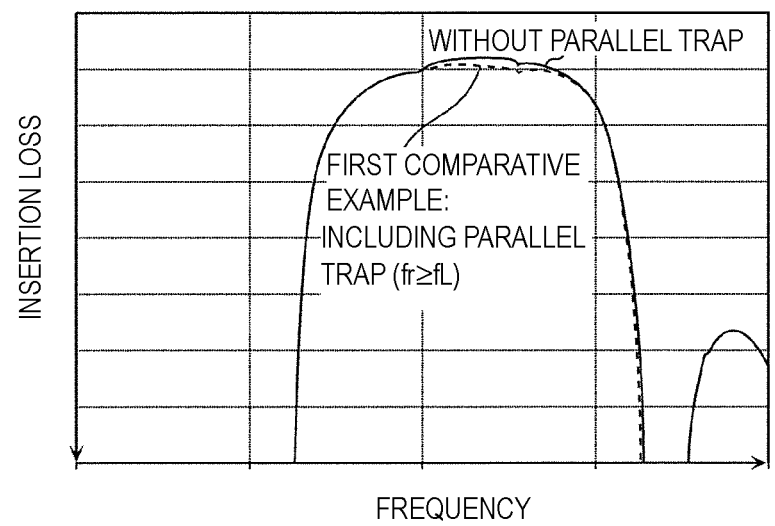
FIG. 8B is a graph illustrating the passband characteristics of each of the elastic wave filter including no parallel trap and the elastic wave filter according to the first comparative example.

To describe the advantageous effects of the second example, FIGS. 8A and 8B comparatively illustrate an elastic wave filter including no parallel trap ("without parallel trap" in the drawings) and an elastic wave filter including a parallel trap that has a resonance point whose frequency is higher than or equal to the low frequency end fL of the passband ("first comparative example" in the drawings). Specifically, FIG. 8A is the Smith chart illustrating the output impedance of each of these two elastic wave filters, and FIG. 8B is a graph illustrating the passband characteristics of each of these two elastic wave filters.

As illustrated in FIG. 8A, the output impedance of the elastic wave filter according to the first comparative example is such that a roll provided in the passband does not rotate and has a shifted position, compared to the output impedance of the elastic wave filter including no parallel trap. That is, the output impedance of the elastic wave filter according to the first comparative example is not only unadjusted to the noise matching impedance NF_min at an end of the passband, but also is shifted away from the gain matching impedance Gain_max at the center of the passband.

Therefore, as illustrated in FIG. 8B, the elastic wave filter according to the first comparative example has a deteriorated (increased) loss in the passband, compared to the elastic wave filter including no parallel trap.

In contrast, in the second example, the parallel trap has a resonance point whose frequency is lower than the low frequency end fL of the passband. Accordingly, both of the gain characteristics and the noise characteristics are able to be achieved.

In the above-described second example, the case where the direction of a roll provided from the low frequency end fL to the high frequency end fH of the passband is preferably on the area (ii) side has been described. However, this roll may be directed to either the area (ii) or the area (iii) by adjusting the capacitive component of the parallel trap. The capacitive component of the parallel trap is able to be adjusted in accordance with, for example, a design parameter (such as the overlapping or intersecting width, number of pairs, pitch, and film thickness) of the IDT electrodes 101a and 101b included in the parallel trap.

In the RF module 1 according to a preferred embodiment of the present invention, for example in the third example, because there is the series trap (i.e., the series resonator 25) which is closest to the output end, compared to a case where there is no series trap, the output impedance Z (Fout) of the elastic wave filter 10 is able to be more easily positioned in the lower left area with respect to the gain matching impedance Gain_max on the Smith chart at both the low frequency end fL and the high frequency end fH of the passband. Therefore, the noise figure of the LNA 40 is able to be decreased at both frequencies of the low frequency end fL and the high frequency end fH.

Specifically, for example in the third example, the series trap has an anti-resonance point whose frequency is higher than the high frequency end fH of the passband. With the series trap having such an anti-resonance point, the output impedance Z (Fout) of the elastic wave filter 10 is able to be adjusted to the gain matching impedance Gain_max at the center of the passband and to the noise matching impedance NF_min at the frequency of at least one of the low frequency end fL and the high frequency end fH of the passband.

This point will be described using a comparative example of the third example (a second comparative example).

Figure 9A:
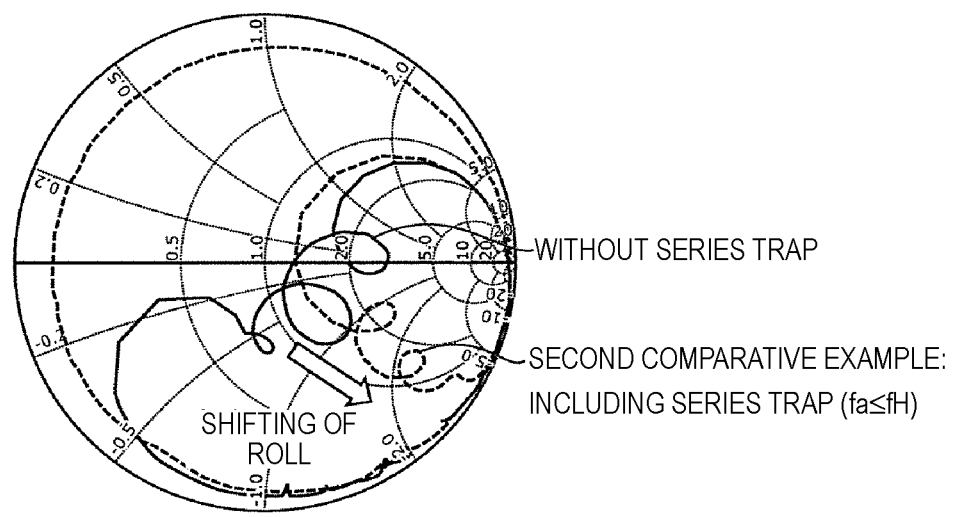
FIG. 9A is the Smith chart illustrating the output impedance of each of an elastic wave filter including no series trap and an elastic wave filter according to a second comparative example.
Figure 9B:
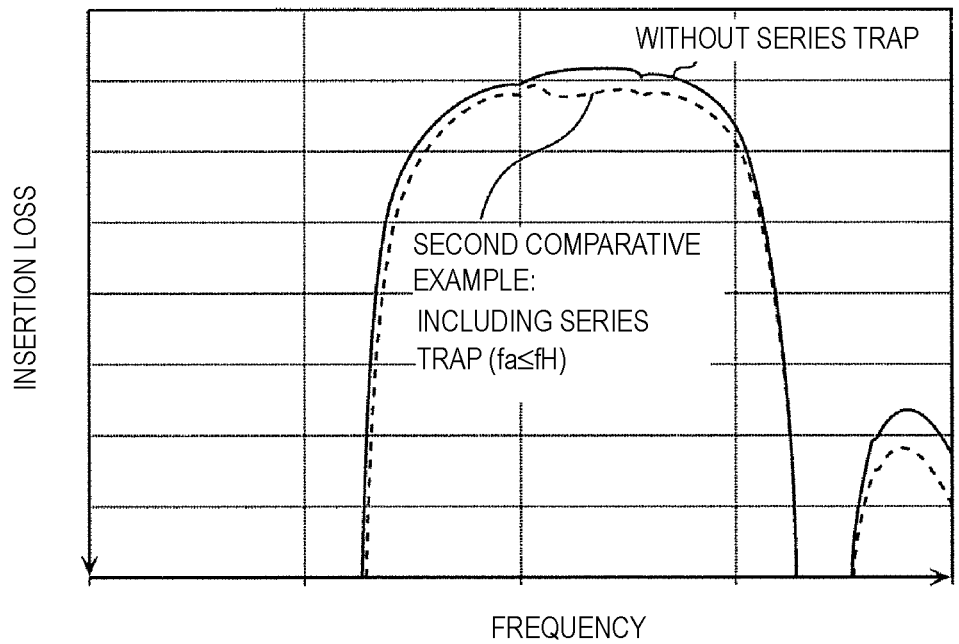
FIG. 9B is a diagram illustrating the passband characteristics of each of the elastic wave filter including no series trap and the elastic wave filter according to the second comparative example.

To describe the advantageous effects of the third example, FIGS. 9A and 9B comparatively illustrate an elastic wave filter including no series trap ("without series trap" in the drawings) and an elastic wave filter including a series trap that has an anti-resonance point whose frequency is lower than or equal to the high frequency end fH of the passband ("second comparative example" in the drawings). Specifically, FIG. 9A is the Smith chart illustrating the output impedance of each of these two elastic wave filters, and FIG. 9B is a diagram illustrating the passband characteristics of each of these two elastic wave filters.

As illustrated in FIG. 9A, the output impedance of the elastic wave filter according to the second comparative example is such that a roll provided in the passband has a shifted position although it rotates, compared to the output impedance of the elastic wave filter including no series trap. In short, the output impedance of the elastic wave filter according to the second comparative example is shifted away from the gain matching impedance Gain_max at the center of the passband.

Therefore, as illustrated in FIG. 9B, the elastic wave filter according to the second comparative example has a deteriorated (increased) loss in the passband, compared to the elastic wave filter including no series trap.

In contrast, in the third example, the series trap has an anti-resonance point whose frequency is higher than the high frequency end fH of the passband. Accordingly, both of the gain characteristics and the noise characteristics are able to be achieved.

In the above-described third example, the case where the direction of a roll provided from the low frequency end fL to the high frequency end fH of the passband is preferably on the area (iv) side has been described. However, this roll may be directed to the area (i) by adjusting the capacitive component of the series trap. Accordingly, the series trap may be provided when the noise matching impedance NF_min is positioned in the area (i) with respect to the gain matching impedance Gain_max. The capacitive component of the series trap is able be adjusted in accordance with, for example, a design parameter (such as the overlapping width, number of pairs, pitch, and film thickness) of the IDT electrodes 101a and 101b included in the series trap.

In the RF module 1 according to a preferred embodiment of the present invention, the locus of the output impedance Z (Fout) in the passband intersects a line connecting the noise matching impedance NF_min and the gain matching impedance Gain_max on the Smith chart. Accordingly, both of the gain characteristics and the noise characteristics are able to be achieved while decreasing deterioration of the noise figure at an end of the passband.

A method of manufacturing the elastic wave filter 10 according to a preferred embodiment of the present invention includes the first step (S10) of obtaining two matching impedances (gain matching impedance Gain_max and noise matching impedance NF_min), and the second step (S20) of manufacturing the elastic wave filter 10 depending on the positional relationship between the obtained two matching impedances on the Smith chart. Accordingly, the elastic wave filter 10 capable of decreasing the noise figure of the LNA 40 at the frequency of at least one of the low frequency end fL and the high frequency end fH of the passband is able to be manufactured. When the elastic wave filter 10 manufactured as described above is applied to, for example, the RF module 1 including the LNA 40, which amplifies an RF signal output from the elastic wave filter 10, transmission characteristics of the RF module 1 are able to be improved.

According to the method of manufacturing the elastic wave filter 10 according to the present preferred embodiment, the output impedance Z (Fout) of the elastic wave filter 10 is able to be more easily positioned closer to the gain matching impedance Gain_max on the Smith chart at both the low frequency end fL and the high frequency end fH of the passband in the following three cases. In other words, these advantageous effects are able to be achieved regardless of any positional relationship on the Smith chart between two matching impedances (gain matching impedance Gain_max and noise matching impedance NF_min). Therefore, the elastic wave filter 10 capable of decreasing the noise figure of the LNA 40 at both frequencies of the low frequency end fL and the high frequency end fH is able to be manufactured. The three cases are as follows: a case where the noise matching impedance NF_min is positioned in the upper left area (the area (i) in preferred embodiments of the present invention) with respect to the gain matching impedance Gain_max on the Smith chart; a case where the noise matching impedance NF_min is positioned in the right area (the area (ii) or (iii) in preferred embodiments of the present invention) with respect to the gain matching impedance Gain_max on the Smith chart; and a case where the noise matching impedance NF_min is positioned in the lower left area (the area (iv) in preferred embodiments of the present invention) with respect to the gain matching impedance Gain_max on the Smith chart.

Although the RF module and the method of manufacturing the elastic wave filter according to the present invention have been described above with reference to preferred embodiments of the present invention using the first to third examples, the present invention is not limited to the above-described preferred embodiments and examples. Modifications obtained by adding various modifications conceivable to those skilled in the art to the above-described preferred embodiments and examples without departing from the scope of the present invention, and various devices such as a communication apparatus including the RF module according to preferred embodiments of the present invention are also included in the present invention.

For example, the above description describes that the elastic wave filter 10 preferably includes the longitudinally-coupled filter structure (i.e., the longitudinally-coupled resonator 23 in the first to third examples), for example. However, the configuration of the elastic wave filter 10 is not limited to this, and the elastic wave filter 10 may include, for example, only a ladder filter structure.

The above description describes that the parallel trap (i.e., the parallel resonator 24 in the second example) has a resonance point whose frequency is lower than the low frequency end fL of the passband. However, the frequency of the resonance point may be higher than or equal to the low frequency end fL of the passband. However, in the elastic wave filter 10 with such a configuration, it is difficult for a roll provided by the output impedance Z (Fout) in the passband to rotate on the Smith chart, and the output impedance Z (Fout) at the center of the passband is easily shifted away from the gain matching impedance Gain_max. Therefore, because both of the gain characteristics and the noise characteristics may deteriorate, it is preferable to appropriately adjust the design parameter (electrode finger film thickness or duty ratio, for example) of the elastic wave filter 10 so as to satisfy specifications, such as characteristics required for the RF module 1, for example.

The above description describes that the series trap (i.e., the series resonator 25 in the third example) has an anti-resonance point whose frequency is higher than the high frequency end fH of the passband. However, the frequency of the anti-resonance point may be lower than or equal to the high frequency end fH of the passband. However, in the elastic wave filter 10 with such a configuration, although a roll provided by the output impedance Z (Fout) in the passband rotates on the Smith chart, the output impedance Z (Fout) at the center of the passband is easily shifted away from the gain matching impedance Gain_max. Therefore, because the gain characteristics may deteriorate, it is preferable to appropriately adjust the design parameter of the elastic wave filter 10 so as to satisfy specifications, such as characteristics required for the RF module 1, for example.

The above description describes that the locus of the output impedance Z (Fout) in the passband intersects a line connecting the two matching impedances (noise matching impedance NF_min and gain matching impedance Gain_max). However, the locus may not intersect the line connecting the two matching impedances. To decrease the deterioration of the gain characteristics, however, it is preferable that the output impedance Z (Fout) at the center of the passband be positioned in the gain maximum area on the Smith chart.

Preferred embodiments and examples of the present invention are applicable to an RF module, a duplexer, a multiplexer, a receiver, or other suitable devices using an elastic wave filter connected to an LNA.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio-frequency (RF) module comprising:
an elastic wave filter; and
a low-noise amplifier (LNA) that amplifies an RF signal output from the elastic wave filter; wherein
an output impedance of the elastic wave filter is positioned, on a Smith chart, closer to a noise matching impedance than to a gain matching impedance, at a frequency of at least one of a low frequency end and a high frequency end of a passband of the elastic wave filter, the noise matching impedance indicating the output impedance where a noise figure of the LNA is minimum, and the gain matching impedance indicating the output impedance where a gain of the LNA is maximum; and
the output impedance of the elastic wave filter is an impedance when viewing an interior of the elastic wave filter from an output end of the elastic wave filter.

2. The RF module according to claim 1, wherein the elastic wave filter includes an elastic wave resonator that utilizes a surface acoustic wave.

3. The RF module according to claim 2, wherein the elastic wave resonator includes a piezoelectric substrate made of an $LiNbO_3$ single crystal, and a pair of inter-digital transducer electrodes having a comb shape or approximate comb shape.

4. The RF module according to claim 3, wherein each of the pair of inter-digital transducer electrodes includes an adhesive layer and a main layer laminated to one another, the adhesive layer improving adhesion between the piezoelectric substrate and the main electrode layer.

5. The RF module according to claim 4, wherein the adhesive layer is made of NiCr.

6. The RF module according to claim 4, wherein the main electrode layer is made of Pt.

7. The RF module according to claim 3, further comprising a protection layer that covers the pair of inter-digital transducer electrodes.

8. The RF module according to claim 7, wherein the protection layer includes silicon dioxide as a main component.

9. The RF module according to claim 1, wherein the elastic wave filter includes a longitudinally-coupled filter structure connected in series with a channel connecting an input end and an output end of the RF module.

10. The RF module according to claim 9, wherein
the noise matching impedance is positioned in a right area with respect to the gain matching impedance on the Smith chart; and
the elastic wave filter includes a parallel trap that is connected to the output end without another resonator disposed therebetween and that is connected in series with a channel connecting the channel connecting the input end and the output end and ground.

11. The RF module according to claim 10, wherein the parallel trap has a resonance point with a frequency that is lower than the low frequency end of the passband.

12. The RF module according to claim 9, wherein
the noise matching impedance is positioned in a lower left area with respect to the gain matching impedance on the Smith chart; and
the elastic wave filter includes a series trap that is connected to the output end without another resonator disposed therebetween and that is connected in series with the channel connecting the input end and the output end.

13. The RF module according to claim 12, wherein the series trap has an anti-resonance point with a frequency that is higher than the high frequency end of the passband.

14. The RF module according to claim 9, wherein
the noise matching impedance is positioned in an upper left area with respect to the gain matching impedance on the Smith chart; and
the longitudinally-coupled filter structure is connected to the output end of the RF module without another resonator disposed therebetween.

15. The RF module according to claim 1, wherein the output impedance is positioned, on the Smith chart, closer to the noise matching impedance at both of frequencies of the low frequency end and the high frequency end of the passband.

16. The RF module according to claim 1, wherein, on the Smith chart, a locus of the output impedance in the passband is intersected with a line connecting the noise matching impedance and the gain matching impedance.

17. The RF module according to claim 1, wherein the elastic wave filter is a band-pass filter.

18. A communication apparatus comprising:
the RF module according to claim 1; and
a radio frequency integrated circuit connected to the RF module.

* * * * *